United States Patent
Sonsky

(10) Patent No.: US 7,906,388 B2
(45) Date of Patent: *Mar. 15, 2011

(54) SEMICONDUCTOR DEVICE AND METHOD FOR MANUFACTURE

(75) Inventor: Jan Sonsky, Leuven (BE)

(73) Assignee: NXP B.V., Eindhoven (NL)

( * ) Notice: Subject to any disclaimer, the term of this patent is extended or adjusted under 35 U.S.C. 154(b) by 304 days.

This patent is subject to a terminal disclaimer.

(21) Appl. No.: 11/911,628

(22) PCT Filed: Apr. 12, 2006

(86) PCT No.: PCT/IB2006/051137
§ 371 (c)(1),
(2), (4) Date: Jun. 13, 2008

(87) PCT Pub. No.: WO2006/109265
PCT Pub. Date: Oct. 19, 2006

(65) Prior Publication Data
US 2009/0127615 A1    May 21, 2009

(30) Foreign Application Priority Data
Apr. 14, 2005  (EP) .................................... 05102977

(51) Int. Cl.
*H01L 21/8238* (2006.01)
(52) U.S. Cl. ......... 438/219; 438/197; 257/368; 257/492; 257/493; 257/E21.483; 257/E29.001
(58) Field of Classification Search .................. 438/739, 438/218–219, 197, 778; 257/E29.001, E21.483, 257/E21.214, 368, 414
See application file for complete search history.

(56) References Cited

U.S. PATENT DOCUMENTS

| | | | |
|---|---|---|---|
| 4,437,226 A | 3/1984 | Soclof | |
| 4,580,331 A * | 4/1986 | Soclof | ............................ 438/337 |
| 4,845,048 A | 7/1989 | Tamaki et al. | |
| 6,285,057 B1 | 9/2001 | Hopper et al. | |
| 6,362,070 B1 * | 3/2002 | Villa et al. | ..................... 438/404 |
| 7,166,488 B2 * | 1/2007 | MacDonald et al. | ........... 438/52 |
| 7,671,390 B2 * | 3/2010 | Sonsky et al. | .................. 257/288 |

FOREIGN PATENT DOCUMENTS

| | | |
|---|---|---|
| JP | 59167029 A | 9/1984 |
| JP | 59167029 A | 11/1984 |

OTHER PUBLICATIONS

Changong, Ren; et al "The Partial Silicon-on-Insulator Technology for RF Power LDMOSFET Devices and on-Chip Microconductors", IEEE Transactions on Electron Devices, vol. 49, No. 12. pp. 2271-2277 (2002).

Pestel; et al "Development of a Robust 50V 0.35 um Based Smart Power Technology Using Trench Isolation", ISPSD, pp. 182-185 (Apr. 2003).

* cited by examiner

*Primary Examiner* — Thanh Nguyen

(57) ABSTRACT

A semiconductor device is formed by forming a second trench 120 at the base of a first trench 18, depositing insulator 124 at the base of the second trench 120, and then etching cavities 26 laterally from the sidewalls of the second trench, but not the base which is protected by insulator 124. The invention may in particular be used to form semiconductor devices with cavities under the active components, or by filling the cavities to form silicon on insulator or silicon on conductor devices.

8 Claims, 6 Drawing Sheets

SEMICONDUCTOR DEVICE AND METHOD FOR MANUFACTURE

The invention relates to a semiconductor device and method for its manufacture, and in particular to a semiconductor device and manufacturing method that permits isolation of components.

Electronic components such as power electronic devices can be integrated onto complementary metal oxide semiconductor (CMOS) logic chips if the power devices can be isolated and/or shielded from the logic circuits. The isolation may provide full isolation or effective shielding of the power devices to avoid disturbing logic functions, and in particular should ideally allow high-side operation of the power electronic devices with the source terminal of the power electronic devices at high voltage.

Furthermore, the isolation or shielding should occupy as small an area of silicon as possible, and be realised with the minimum number of additional masks and process steps to ensure commercial viability.

One known isolation technique is to use a combination of a buried n-type layer and deep trenches, as set out in Pestel et al, "Development of a robust 50V 0.35 µm based smart power technology using trench isolation", ISPSD 2003 pages 182 to 185.

Another option is to use silicon-on-insulator (SOI) wafers. However, such SOI wafers are often too expensive for competitive production.

A further isolation technique is disclosed in U.S. Pat. No. 4,845,048 (Tamaki et al). In this technique, trenches are formed in silicon, oxide and nitride layers deposited on the sidewalls and then an isotropic dry etch is used to etch the silicon under the trenches. Then, the resulting structure is heat treated in an oxidising atmosphere to form oxide. The oxide extends between the trenches to form a continuous oxide layer over the exposed surfaces.

A very similar approach is described in Changong Ren et al, "The partial silicon-on-insulator technology for RF power LDMOSFET devices and on-chip microinductors", IEEE Transactions on Electron Devices Volume 49 Number 12 pages 2271 to 2277 (2002). Again, an oxide platform is formed.

However, these options have not been widely adopted, if at all, and there remains a need for a practical way of gaining some or all of the benefits of a silicon on insulator structure without the expense and manufacturing difficulty of such structures.

According to the invention there is provided a method of manufacturing a semiconductor device, comprising the steps:

(a) providing a semiconductor body with opposed first and second major surfaces;

(b) etching a plurality of laterally spaced longitudinal first trenches from the first major surface towards the second major surface;

(c) forming spacers on the sidewalls of the first trenches to protect at least part of the sidewalls of the trenches from etching;

(d) etching second trenches at the base of the trenches, (e) forming an insulator on the base of the second trenches but not on the sidewalls of the second trenches; and (f) etching cavities starting at the sidewalls of the second trenches and extending laterally.

The step of forming insulator on the base of the second trenches may include:

depositing nitride on the sidewalls of the first and second trenches and the base of the second trenches;

carrying out a vertical etch to etch the nitride from the base of the second trenches, forming oxide on the base of the second trenches, and then removing the nitride by a selective etch for nitride over oxide leaving oxide on the base of the second trench and the sidewalls of the second trench free of oxide and nitride.

The step of etching the cavities may include etching the cavities for sufficient time that cavities from adjacent trenches join.

Unlike the structure of U.S. Pat. No. 4,845,048 discussed above, the cavities etched at the base of the trenches need not be discrete but may join together to form a single laterally extending cavity. This allows increased flexibility in that it permits the use of a wide variety of materials to fill the cavities, not just oxide of semiconductor as in U.S. Pat. No. 4,845,048.

The semiconductor devices have some of the benefits of silicon on insulator (SOI) devices in terms of device isolation. The devices may be used for power semiconductor devices, and also in particular for devices intended to be resistant to α-particles, for example for use in space. Only a limited length of α-particle track will be above the cavities, so a large fraction of any charge generated will be below the cavities away from the device. This reduces sensitivity of the semiconductor device to α-particles.

In embodiments, the method may include:

forming a drain region on the first major surface and laterally spaced source regions on either side of the drain region; and defining an insulated gate to control conduction between source and drain regions through a body region;

wherein the step of etching the trenches etches the trenches through the drain region and/or the source regions; and the step of etching the cavities includes etching the cavities to extend between the source and drain regions under the source, drain and body regions.

The step of etching the trenches may etch the trenches through the drain region and the step of etching the cavities may include etching the cavities from under the drain region to extend as far as under the source region.

Alternatively, the step of etching the trenches may etch the trenches through the source regions, and the step of etching the cavities may include etching the cavities to extend from under each source region to meet under the drain region.

The cavities may be filled, either with conductor or insulator, or may be left unfilled.

In another aspect, the invention relates to a semiconductor device comprising:

a semiconductor body with opposed first and second major surfaces;

a plurality of laterally spaced longitudinal trenches extending from the first major surface towards the second major surface;

cavities at the base of the trenches; and at least one electronic semiconductor component in the semiconductor body between the trenches, the at least one electronic semiconductor component being a transistor, a diode, and/or a junction semiconductor device;

wherein the semiconductor device comprises an insulator at the base of the trenches, the cavities extending laterally from the sidewalls at the base of the trenches.

The electronic components may be, for example, power electronic devices such as power MOSFETs, power diodes, or power bipolar transistors. The invention is of particular benefit in such power electronic devices since these can have a large effect on logic circuits.

Embodiments of the invention will now be described, purely by way of example, with reference to the accompanying drawings in which.

Like and similar components are given the same reference numerals and the description of such like and similar components is not repeated for each and every embodiment for brevity. The drawings are schematic and not to scale.

Figure 1:
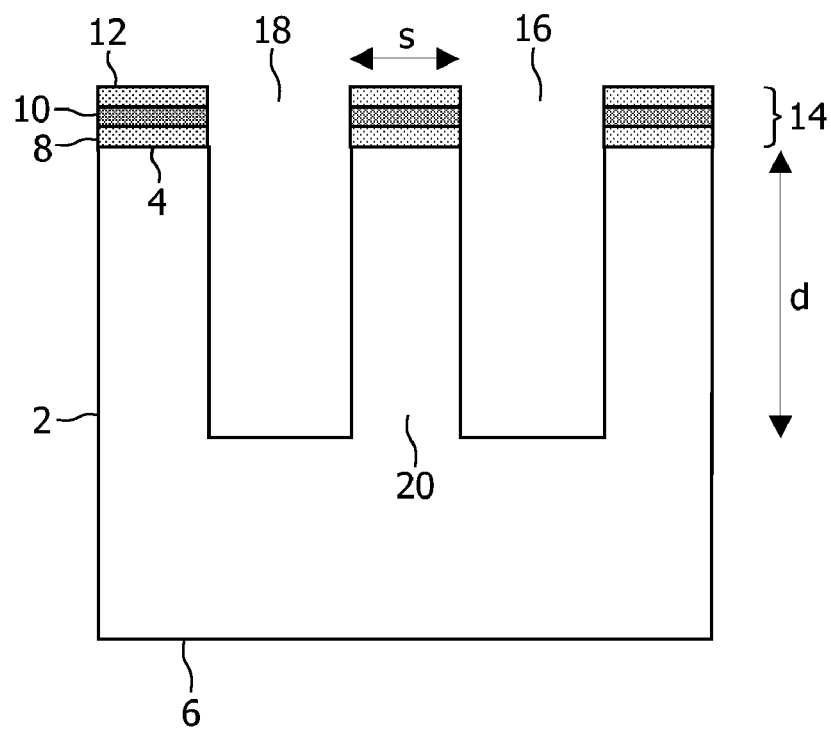
FIGS. 1 to 8 show steps in the manufacture of a semiconductor device according to a first embodiment of the invention.

Referring to FIG. 1, a silicon semiconductor substrate 2 is provided having a first (front) major surface 4 and a second (rear) major surface 6. An oxide layer 8, a nitride layer 10 and another oxide layer 12 are deposited on the first major surface 4 and patterned to form a hard mask 14 defining openings 16. First trenches 18 are then etched using dry etching resulting in the stage shown in FIG. 1.

The lateral spacing s between neighbouring trenches is preferably less than 1 μm, preferably less than 0.5 μm, and in the embodiment shown is 0.2 μm. The depth d of the trenches is preferably in the range 0.4 to 2 μm, and in the embodiment shown is 1.5 μm. Note that figures are schematic and in particular the vertical scale of the figure is not the same as the horizontal scale for clarity.

Semiconductor 20 remains between the trenches 18.

An optional step may be included here of etching off the upper oxide layer 12 by dipping the structure in hydrofluoric acid (HF). Note that this step is omitted in the specific embodiment described.

Figure 2:
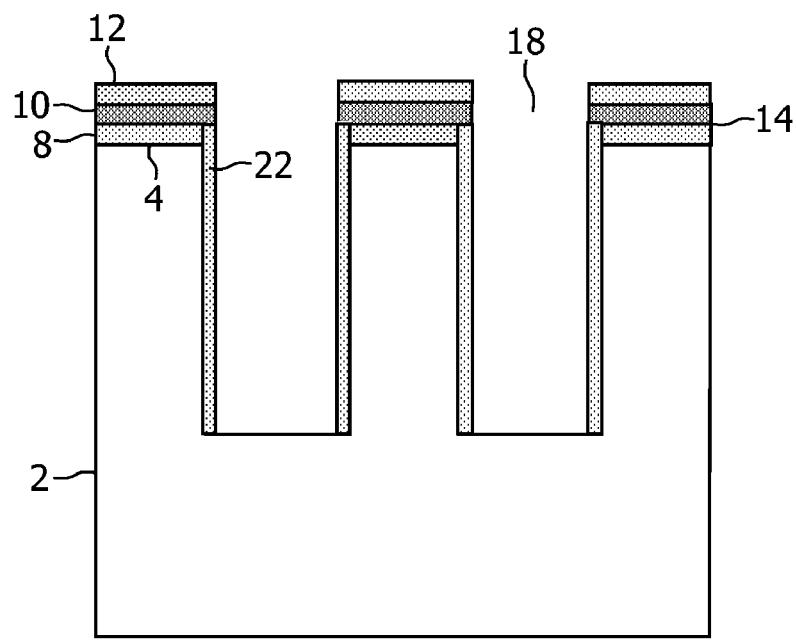

A dry oxidation step then oxidises the sidewalls and base of the trench 18 forming oxide layer 22, which in the example has a thickness of 30 nm. The oxide layer 22 forms spacers. The top surface is protected with an oxide nitride oxide (ONO) stack 14, and the oxide layer 22 removed from the base of the trench leaving oxide spacers 22 on the sidewalls of the trench but not the base. This results in the stage shown in FIG. 2.

Figure 3:
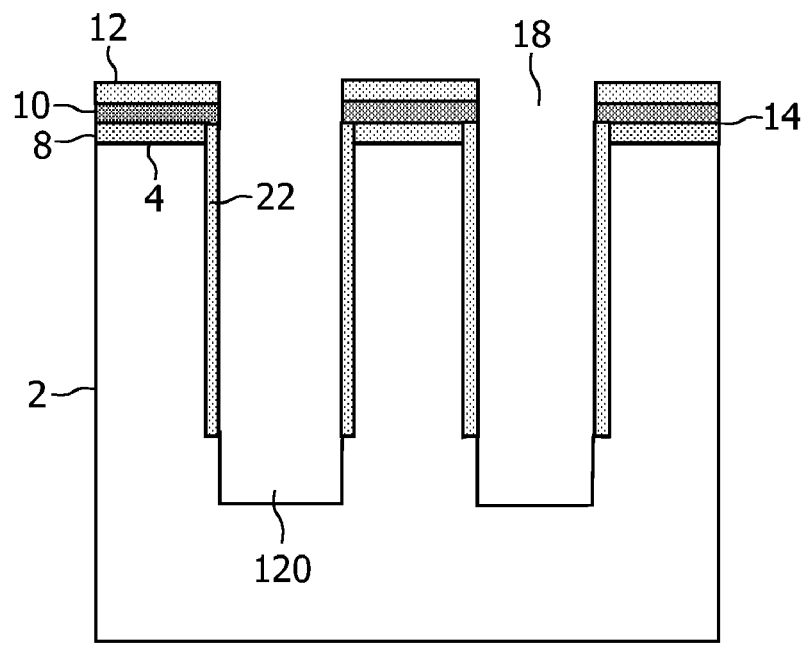

Then, a second vertical trench 120 is etched using an anisotropic etch such as a reactive ion etch to leave a lower trench 120 without oxide spacer at the base of the trench 18 as shown in FIG. 3.

Figure 4:
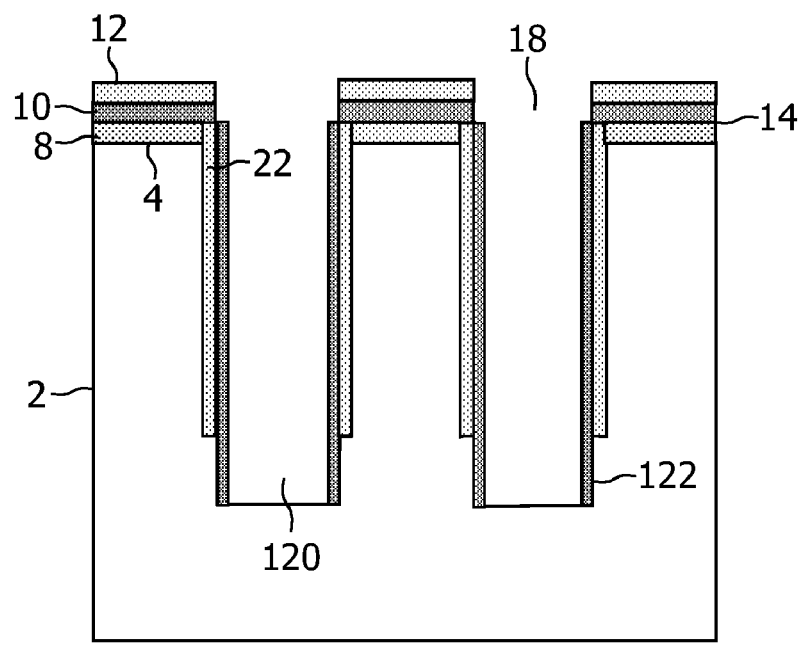

A nitride spacer 122 is then formed on the sidewalls and base of the trench 18 and second trench 120. The nitride spacer 122 on the base of the second trench 120 is etched away using a vertical etch to leave the nitride spacer 122 on the sidewalls of the trenches 18, 120 only as shown in FIG. 4.

Figure 5:
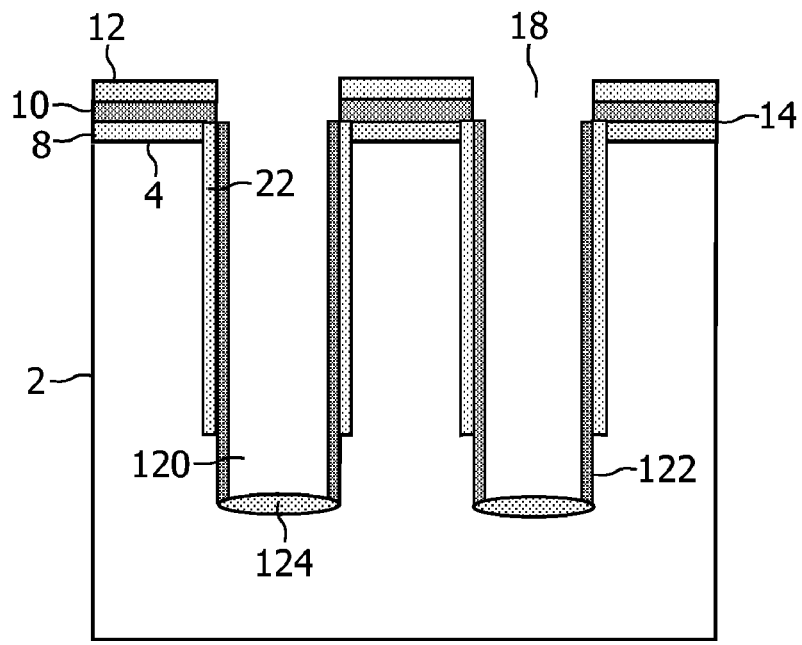

Next, a 30-40 nm thick oxide layer 124 is grown on the base of the trench 18 by thermal oxidation, as shown in FIG. 5. The nitride spacer 122 prevents the side walls of the trench from being oxidised.

Figure 6:
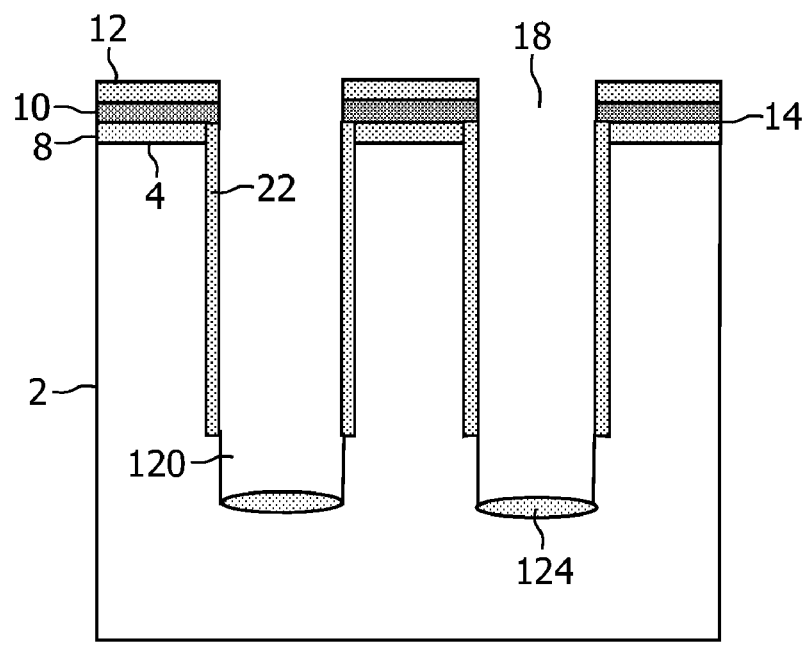

The nitride spacer layer 122 is then etched away leaving the oxide layer 124 on the base of the trench and the oxide layer 22 on the trench 18 but without an oxide layer being present on the sidewalls of the lower trench 120, as shown in FIG. 6.

Figure 7:
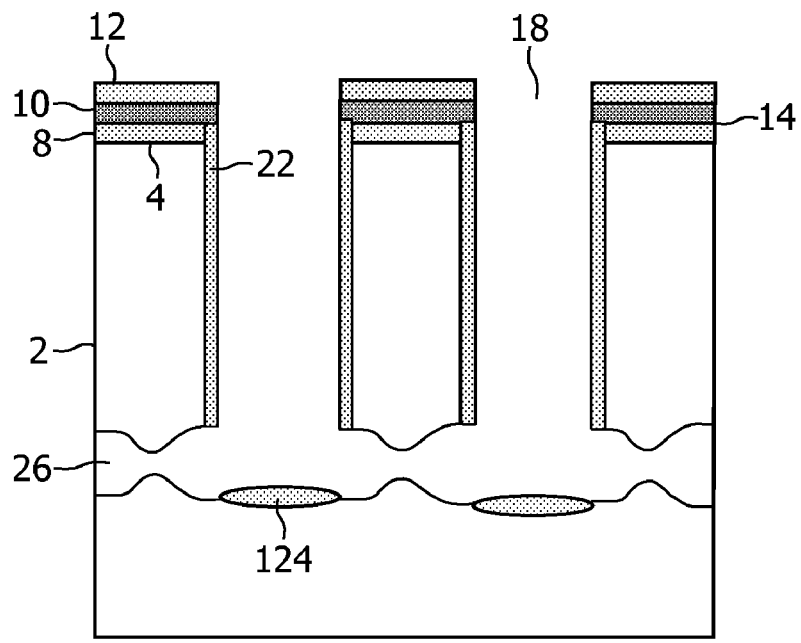

Next, an isotropic etch is carried out. The oxide layer 124 on the base of the trench means that the base is not etched and similarly the oxide spacers 22 protect the sidewalls of first trench 18. Thus the isotropic etch forms a cavity 26, extending from the unprotected sidewalls of second trench 120, that has a greater lateral extent than vertical extent. As can be seen in FIG. 7, the isotropic etch is carried out until the cavities 26 under each trench join up to isolate the surface of the semiconductor device.

In the first embodiment, processing continues to fill the trench. However, because the cavity 26 has a lower volume for the same lateral extension than that produced without oxide layer 124, the trench and/or cavity is easier to fill.

The semiconductor body 20 is supported in this embodiment by regions longitudinally spaced from the cavity as will be explained below.

Figure 8:
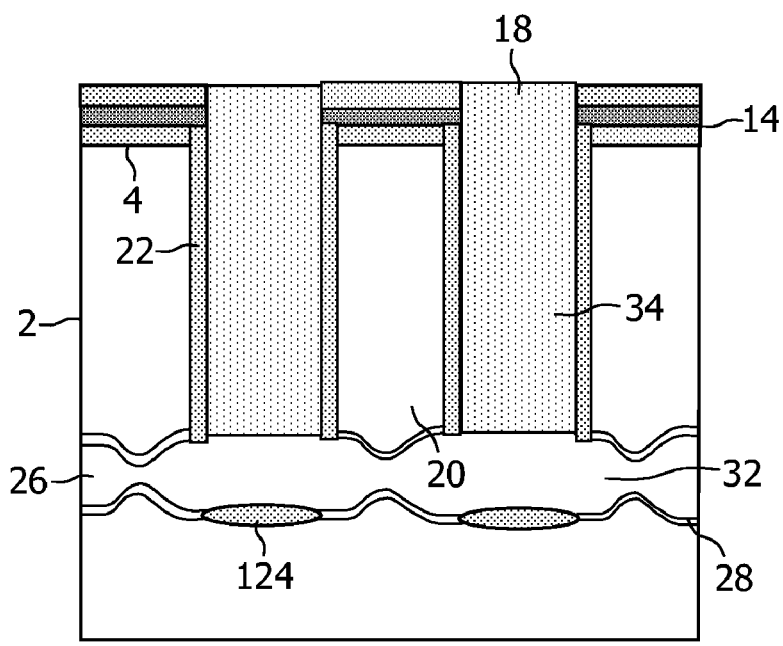

Next, the walls of the cavities 26 are oxidised forming an insulating oxide layer 28 in the cavities as shown in FIG. 8. The oxide layer 28 has approximately the same thickness in the cavities as the oxide layer 22 on the trench sidewalls.

Doped, conductive polysilicon is then deposited in the cavities forming a lower field plate 32 under the semiconductor 20 as shown in FIG. 8.

The trench is then filled with conductor 34.

In a variation, the cavities 26 are filled with conductor forming lower field plate 32 but the trenches 18 are filled not with conductor but with insulator. This is achieved by filling the trenches and cavities with polysilicon as in the first embodiment, and then etching back the polysilicon to the depth of the trench 18.

The invention also relates to arrangements in which the cavities are filled with insulator, not conductor. The cavities may be filled by deposition or growth, for example of oxide, or other methods that will be familiar to those skilled in the art. In particular, the method may include filling the cavities at least partially with a material with a dielectric constant K value greater than that of silicon dioxide.

Semiconductor components, in this instance FETs, are then formed using processing steps known to those skilled in the art. In this embodiment, formation of the semiconductor components after the oxidation step of the cavity is preferred since the conditions for carrying out the oxidation would cause any implants in the semiconductor components to diffuse.

A high voltage MOSFET may be made using the method described with reference to the embodiment of FIG. 9. A high voltage MOSFET is illustrated in FIG. 9.

An n+ source diffusion 132 is provided as is an n+ drain diffusion 134. p− type body diffusion 136 has a p+ type body contact 138. A source contact 140 is in contact with the source diffusion 132 and body contact 138. A drain contact 142 is in contact with the drain diffusion. A gate 144 is separated from the semiconductor by gate insulator 146 that is thin over the p-type body region 136 and has a thicker region over drift region 148. Note that the drain 134 is in the centre and the source diffusions 132 at the outside.

Figure 9:
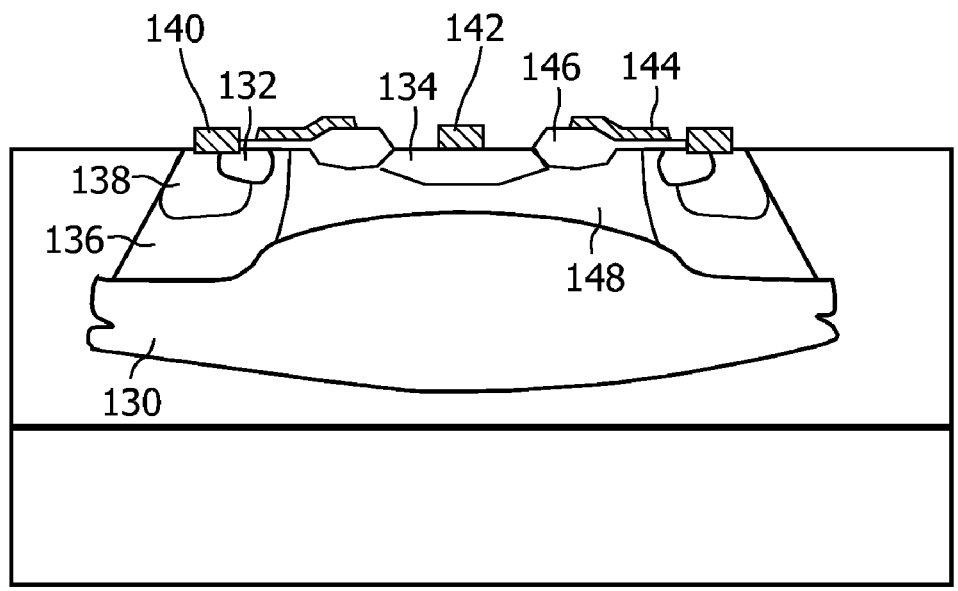
FIG. 9 illustrates a further embodiment of a device according to the invention.

Note a particular feature of the MOSFET of FIG. 9 is the cavity 130 under the MOSFET, which in this embodiment is not filled.

The presence of the cavity gives a substantially higher breakdown voltage in the reduced surface field (RESURF) condition that would be present for a silicon on insulator device with otherwise similar properties. For example, for a 1 μm thick cavity, instead of a 1 μm thick layer of oxide, and similar properties, calculations give a breakdown voltage of 370V for the device on a cavity instead of 107V for the device on oxide.

The cavity can be etched using the method of FIGS. 1 to 8 as follows.

Figure 10:
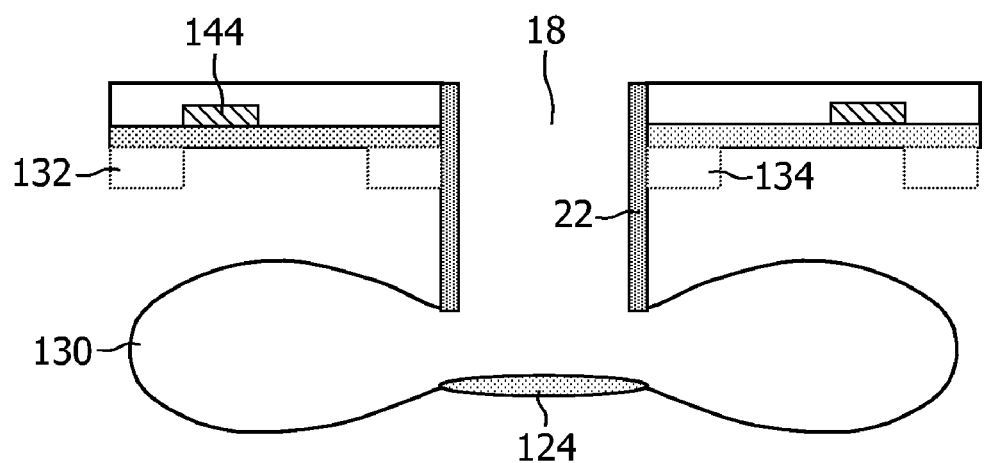
FIGS. 10 and 11 illustrate one way of making a device according to FIG. 9.
Figure 11:
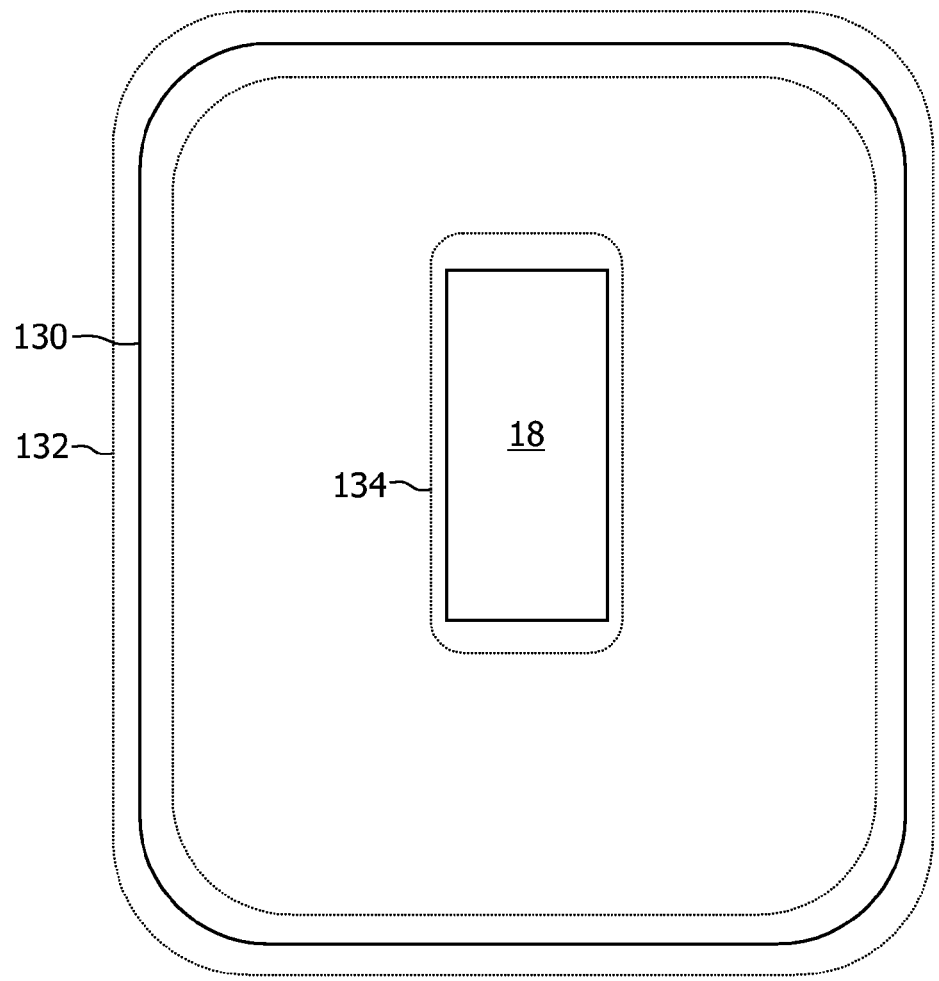

In the arrangement of FIGS. 10 and 11, the cavity is etched using trenches 18 at the central drain diffusion 134. The cavity 130 (shown using the full line in FIG. 11, is etched out under drift region 138 as far as being under the source diffusion 132 (shown using dotted lines in FIG. 11).

Figure 12:
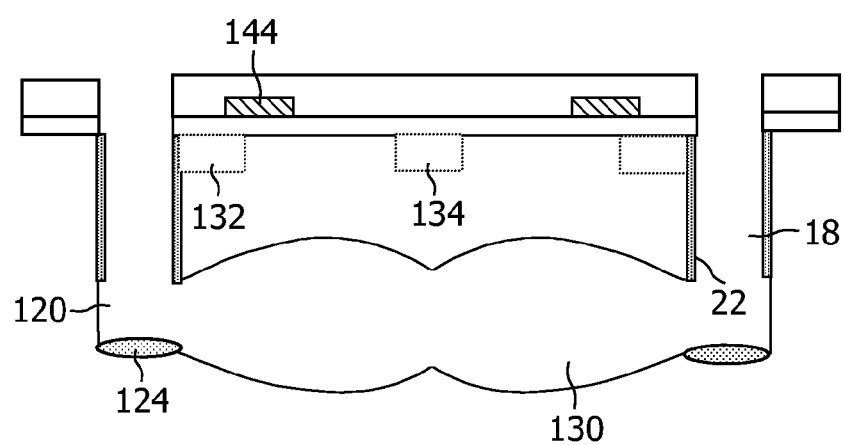
FIG. 12 illustrates another way of making a device according to FIG. 9.

FIG. 12 shows an alternative arrangement in which a cavity 26 is etched inward from outside the outer source diffusions 132. The cavity 26 is etched from both sides until the etches meet under drain diffusion 134 to create a cavity under the whole device.

For simplicity FIGS. 10 to 12 do not show the full device structure of FIG. 9, only the gates 144, but the full structure is present in these device.

The depth of the first trench 18 etched in these devices determines the thickness of the drift layer 148, and the thickness of the second trench 120 determines the thickness of the cavity.

Even where the cavities are insulated, the use of conductor in the trenches gives rise to benefits, especially where the conductor in the trenches can act as a field plate giving reduced surface field effects.

Using these techniques, very effective RESURF-type devices can be used.

The device produced can operate as a high voltage device using a field plate over a cavity for improved operation.

The skilled person will realise that these approaches can be combined, n-type and p-type regions may be interchanged, and that different materials may be substituted for those specifically described.

In particular, the arrangements of FIGS. 9 to 12 may be used with filled cavities and the arrangements of FIGS. 1 to 8 with unfilled cavities instead of the arrangements described with reference to those figures.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

There is no need to use silicon, but the invention is also applicable to other group IV, III-V or II-VI semiconductors and indeed any other semiconductor material.

The invention claimed is:

1. A method of manufacturing a semiconductor device, comprising
    providing a semiconductor body with opposed first and second major surfaces; etching a plurality of laterally spaced longitudinal first trenches from the first major surface towards the second major surface;
    forming spacers on the sidewalls of the first trenches to protect at least part of the sidewalls of the trenches from etching; etching second trenches at the base of the first trenches;
    forming an insulator on the base of the second trenches but not on the sidewalls of the second trenches; and
    etching cavities starting at the sidewalls of the second trenches and extending laterally.

2. The method as recited in claim 1, wherein forming insulator on the base of the second trenches includes:
    depositing nitride on the sidewalls of the first and second trenches and the base of the second trenches;
    carrying out a vertical etch to etch the nitride from the base of the second trenches,
    forming oxide on the base of the second trenches, and then removing the nitride by a selective etch for nitride over oxide leaving oxide on the base of the second trench and the sidewalls of the second trench free of oxide and nitride.

3. The method as recited in claim 1 wherein, etching the cavities includes etching the cavities for sufficient time that cavities from adjacent trenches join.

4. A method as recited in claim 1, comprising: forming a drain region on the first major surface and laterally spaced source regions on either side of the drain region; and defining an insulated gate to control conduction between source and drain regions through a body region; wherein etching the first trenches etches the first trenches through the drain region and/or the source regions; and etching the cavities includes etching the cavities to extend between the source and drain regions under the source, drain and body regions.

5. A method according to claim 4 wherein etching the first trenches etches the first trenches through the drain region; and etching the cavities includes etching the cavities from under the drain region to extend as far as under the source region.

6. A method according to claim 4 wherein etching the first trenches etches the first trenches through the source regions; and etching the cavities includes etching the cavities to extend from under each source region to meet under the drain region.

7. A method according to claim 1 further comprising filling the cavities.

8. A semiconductor device comprising: a semiconductor body with opposed first and second major surfaces; a plurality of laterally spaced longitudinal trenches extending from the first major surface towards the second major surface; cavities at the base of the trenches; and at least one electronic semiconductor component in the semiconductor body between the trenches, the at least one electronic semiconductor component being a transistor, a diode, a junction semiconductor device, or a combination, thereof; wherein the semiconductor device comprises an insulator at the base of the trenches, the cavities extending laterally from the sidewalls at the base of the trenches.

* * * * *